(12) United States Patent
Mazure et al.

(10) Patent No.: US 9,035,474 B2
(45) Date of Patent: May 19, 2015

(54) METHOD FOR MANUFACTURING A SEMICONDUCTOR SUBSTRATE

(75) Inventors: Carlos Mazure, Bernin (FR); Richard Ferrant, Esquibien (FR); Konstantin Bourdelle, Crolles (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 600 days.

(21) Appl. No.: 12/793,515

(22) Filed: Jun. 3, 2010

(65) Prior Publication Data

US 2011/0241157 A1  Oct. 6, 2011

(30) Foreign Application Priority Data

Apr. 6, 2010 (EP) .................................... 10290181

(51) Int. Cl.
*H01L 23/544* (2006.01)
*H01L 21/762* (2006.01)
*H01L 21/18* (2006.01)
*H01L 21/20* (2006.01)

(52) U.S. Cl.
CPC ........ *H01L 21/76254* (2013.01); *H01L 21/187* (2013.01); *H01L 21/2007* (2013.01); *H01L 21/76251* (2013.01)

(58) Field of Classification Search
USPC .................................. 438/455–459; 257/797
See application file for complete search history.

(56) References Cited

U.S. PATENT DOCUMENTS

| | | | |
|---|---|---|---|
| 4,169,233 A | 9/1979 | Haraszti | 307/355 |
| 4,534,804 A * | 8/1985 | Cade | 438/694 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,866,447 A | 2/1999 | Liu | |
| 5,866,477 A | 2/1999 | Liu | 438/229 |
| 5,869,872 A | 2/1999 | Asai et al. | 257/360 |
| 5,889,293 A | 3/1999 | Rutten et al. | 257/74 |

(Continued)

FOREIGN PATENT DOCUMENTS

EP  1 081 748 A2  3/2001
EP  1 095 407 A1  5/2001

(Continued)

OTHER PUBLICATIONS

I. Hassoune et al. "Double-gate MOSFET Based Reconfigurable Cells", The Institution of Engineering and Technology, Electronics Letters, vol. 43, No. 23, 3 pages (2007).

(Continued)

*Primary Examiner* — Matthew Reames
(74) *Attorney, Agent, or Firm* — TraskBritt

(57) ABSTRACT

The invention relates to a method for manufacturing a semiconductor substrate, in particular, a semiconductor-on-insulator substrate by providing a donor substrate and a handle substrate, forming a pattern of one or more doped regions typically inside the handle substrate, and then attaching such as by molecular bonding the donor substrate and the handle substrate to obtain a donor-handle compound.

15 Claims, 4 Drawing Sheets

(56) References Cited

U.S. PATENT DOCUMENTS

| | | | |
|---|---|---|---|
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 2001/0001500 A1* | 5/2001 | Ohashi et al. | 257/506 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0112848 A1* | 5/2005 | Faris | 438/458 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0205139 A1 | 9/2006 | Kijima et al. | 438/232 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0215921 A1* | 9/2007 | Hsu et al. | 257/290 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/154 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096036 A1 | 4/2009 | Ishigaki et al. | 257/392 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0182538 A1 | 7/2009 | Yanami et al. | 703/2 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004179506 | 6/2004 |
| JP | 2004303499 | 10/2004 |
| JP | 2008147332 | 6/2008 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).

John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).

John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).

Paul Beckett, XP-002579039, "Performance Characteristics of a Nanoscale Double-gate Reconfigurable Array", Proc. Of SPIE, vol. 7268, pp. 72680E-1-72680E-12 (2008).

K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).

K. J. Kuhn, "Variation in 45nm and Implications for 32nm and Beyond", Intel, 2009 $2^{nd}$ International CMOS Variability Conference—London, pp. 1-86.

Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).

E.I. Dimitris, et al. "Opposite-Channel-Based Injection of Hot-Carriers in SOI MOSFET's: Physics and Applications" IEEE Transactions on Electron Devices, vol. 45, No. 5, pp. 1147-1154 (1998).

K. Itoh, et al., "Impact of FD-SOI on Deep-Sub-100-nm CMOS LSIs—A View of Memory Designers" Central Research Laboratory, Tokyo, Japan, 2 pages.

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

(56) References Cited

OTHER PUBLICATIONS

P. Nasalski, et al. "An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).
P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).
T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).
R. Kaushik, et al. "Double-Gate SOI Devices for Low-Power and High-Performance Applications," IEEE Computer Society, The British Library, IEEE Xplore, 8 pages, (2006).
R. Tsuchiya, et al., "Silicon on Thin BOX: A New Paradigm of the CMOSFET for Low-Power and High-Performance Application Featuring Wide-Range Back-Bias Control" 2004 IEEE, 4 pages.
R. Tushiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).
Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).
M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

U.S. Appl. No. 12/793,553, filed Jun. 3, 2010.
U.S. Appl. No. 12/789,100, filed May 27, 2010.
European Search Report Application No. EP 10 29 0217 dated Sep. 15, 2010.
U.S. Appl. No. 12/886,421, filed Sep. 20, 2010.
U.S. Appl. No. 12/961,293, filed Dec. 6, 2010.
U.S. Appl. No. 12/984,466, filed Jan. 4, 2011.
U.S. Appl. No. 12/942,754, filed Nov. 9, 2010.
European Search Report Application No. EP 10290181.6 dated Jan. 14, 2011.
U.S. Appl. No. 13/007,483 filed Jan. 14, 2011.
U.S. Appl. No. 13/013,580, filed Jan. 25, 2011.
U.S. Appl. No. 12/880,806, filed Sep. 13, 2010.
U.S. Appl. No. 12/898,230, filed Oct. 5, 2010.
U.S. Appl. No. 12/946,135, filed Nov. 15, 2010.
U.S. Appl. No. 12/974,916, filed Dec. 21, 2010.
U.S. Appl. No. 12/974,822, filed Dec. 21, 2010.
U.S. Appl. No. 13/039,167, filed Mar. 2, 2011.
European Search Report Application No. EP 09290838.3 dated Feb. 16, 2010.
K. Roy, et al. "Double-Gate SOI Devices for Low-Power and High-Performance Applications", IEEE Computer Society, The British Library, IEEE Xplore, 8 pages, (2006).
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).
Ulicki, Bob et al., "De-Myth-tifying" the SOI Floating Body Effect, SOI Industry Consortium, pp. 2-7 (2009).

* cited by examiner

METHOD FOR MANUFACTURING A SEMICONDUCTOR SUBSTRATE

CROSS-REFERENCE TO RELATED APPLICATION

This application claims the benefit under Article 8 of the Patent Cooperation Treaty and under 35 U.S.C. §119(e) to European Patent Application Serial No. 10290181.6, filed Apr. 6, 2010.

BACKGROUND

TECHNICAL FIELD

The invention relates to a method for manufacturing a semiconductor substrate, in particular, a semiconductor-on-insulator (SOI) substrate with a pattern of one or more doped regions therein.

Complex semiconductor substrates may be manufactured by combining two or more layers. One class of such engineered substrates are semiconductor-on-insulator substrates, wherein a top semiconductor layer is formed over a carrier substrate with a dielectric layer in between. For the top semiconductor layer and the carrier substrate, usually silicon is used and the dielectric layer is usually an oxide layer, typically a silicon oxide.

Especially, "fully depleted" SOIs (FDSOIs) often take advantage of doped areas inside the carrier substrate with a back bias for tuning the threshold voltage of devices formed on the top semiconductor layer.

For the fabrication of the doped areas below the buried dielectric, ions are usually implanted through the top semiconductor layer and the buried dielectric layer. This method has, however, the drawback that a tail of the implantation profile impacts the initial doping level of the top semiconductor layers, thereby altering the device characteristics and generating a random dopant fluctuation (RDF), which undesirably induces threshold voltage variability.

In order to avoid such dopant contamination and damage of the channel region through the high dose and/or implantation tail, it has been proposed to implant through the top semiconductor layer and the buried dielectric layer deeply into the carrier substrate. This method, however, requires thermal annealing steps that are essential to diffuse the dopant upward toward the interface between the carrier substrate and the buried dielectric. Thus, it makes it more difficult and not possible to obtain the desired dopant level for circuit optimization.

Furthermore, the active dopant level at the interface between the carrier substrate and the buried dielectric layer cannot be very high, and is typically smaller than $1.0 \times 10^{19}$ cm$^{-3}$. This limits the possibility of using implanted doped patterns to generate buried circuitry.

Accordingly, there is a need in the art for providing doped patterns in such structures, and these are now provided by the present invention.

BRIEF SUMMARY

The present invention now provides an improved method for fabricating a semiconductor substrate, in particular, a semiconductor-on-insulator substrate, having one or more doping regions.

Accordingly, one aspect of the method of the present invention comprises providing a donor substrate and a handle substrate; forming a pattern of one or more doped regions inside the handle substrate; and attaching the donor and the handle substrates together to obtain a semiconductor substrate as a donor-handle combination. Alternatively, the method comprises providing a donor substrate and a handle substrate; forming one or more alignment marks inside the handle substrate; and attaching the donor and the handle substrates together to obtain a semiconductor substrate as a donor-handle combination.

The pattern can be formed by at least one ion implantation step for implanting the dopant, while the one or more alignment marks can be formed by ion implantation of a non-dopant species such as H, He, Ar, F, Ne, Xe or a combination thereof. The forming can be conducted during thermal annealing of the donor-handle combination.

The substrates formed by the methods disclosed herein represent another embodiment of the invention.

BRIEF DESCRIPTION OF THE DRAWINGS

Advantageous embodiments will be described in combination with the enclosed figures, wherein.

DETAILED DESCRIPTION

Figure 1A:
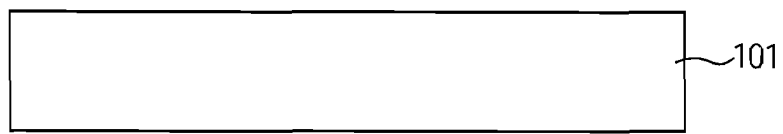
FIGS. 1a to 1e illustrate a handle substrate at different steps of an exemplary method for manufacturing a semiconductor substrate according to the invention.

As noted, a primary feature of the invention is a method for manufacturing a semiconductor substrate, in particular, a semiconductor-on-insulator (SOI) substrate, comprising the steps of: a) providing a donor substrate and a handle substrate, b) forming a pattern of one or more doped regions in, in particular inside, the handle substrate, and then c) attaching, in particular by bonding, the donor and the handle substrate to obtain a donor-handle compound.

By forming the pattern of one or more doped regions in the handle substrate prior to attaching the donor and the handle substrate, the creation of tails in other layers of the semiconductor substrate can be suppressed and the formation of doped regions with desired dimensions, dopant level and profiles can be enabled. Further, the negative effects of so-called resist edge ion implantation deflection can be suppressed or at least reduced to a level that typically does not have any impact on the dopant profiles. This may help in reducing the dimensions of the circuits on the substrate.

Each of the donor substrate and the handle substrate may be a semiconductor substrate, in particular, a silicon substrate.

Prior to attaching the donor and the handle substrate, the handle and/or the donor substrate may be prepared for bonding, e.g., by cleaning, or any suitable surface treatments.

According to an advantageous realization, the method may further comprise a step d) carried out between steps a) and b), which consists in forming one or more alignment marks in, in particular, inside, the handle substrate. Alignment marks will allow the formation of the pattern at predetermined locations of the handle substrate such that the doped regions can be aligned with corresponding regions in other layers of the substrate, in particular, in the donor substrate or other doped patterns in the handle substrate.

In this context, the term "inside" means that the alignment marks are buried, typically in a depth of less than about 10 µm, such that the surface of the handle substrate is essentially unaffected by the alignment marks.

Further advantage of forming the alignment marks and/or implanting the dopant patterns below the handle substrate surface is that the surface remains essentially unaffected such that the bonding quality of the handle substrate is better compared to the prior art. This invention is independent of the lithography technique utilized. It remains compatible with the most advanced lithography techniques like immersion, EUV (extreme ultraviolet), and e-beam lithography.

In particular, the one or more alignment marks may be formed by ion implantation. In this way, the alignment marks essentially do not alter the surface of the handle substrate as compared to alignment marks formed by filled trenches as known in the art. The alignment marks or structures used in the prior art have to be typically planarized using thick dielectric layers and the material mix could even lead to stress inside the material. The use of the prior art may also cause formation of voids at the bonding interface. Thus, whereas the prior art marks could not be combined with thin dielectric layers or semiconductor layers, the ion implanted alignment marks are compatible with thinner buried dielectric layers, for example, having a thickness smaller than 200 nm, in particular smaller than 100 nm, as stress can be prevented and no planarization becomes necessary. The handle substrate surface in the inventive method remains better prepared for bonding.

Further preferred, the one or more alignment marks may comprise a non-dopant species, in particular, hydrogen (H), helium (He), argon (Ar), fluorine (F), neon (Ne) and/or xenon (Xe), or a combination of two or more elements. In particular, argon may be used as it is cheap and commonly used to clean up the beam line of implanters, so that the implementation of the method can be easily achieved.

The alignment marks could, according to a variant, also be achieved using a different technique, e.g., focused laser melting or focused ion beam melting.

According to a preferred embodiment, step d) may comprise a thermal annealing step. By the thermal annealing step, the optical contrast between the alignment marks and surrounding substrate material can be enhanced, i.e., defects like the growth of nano- or micro-cavities may be induced. The position and the shape of the alignment marks remain stable. In this way, a predetermined distribution of the nano- or micro-cavities can be created, locally changing the optical properties of the handle substrate. These can be observed in an alignment tool so that a lithography tool can correctly align the subsequent doped patterns in the handle and/or transferred layer of the donor substrate.

Advantageously, step b) may comprise at least one ion implantation step for implanting a dopant, in particular, phosphorous and/or arsenic and/or boron and/or indium, and/or antimony. Dopant implantation targets the formation of n and p doped regions in the handle substrate. Thus, desired regions with n- and/or p-type dopant concentrations can be formed within the handle substrate.

The at least one ion implantation step may be followed by an annealing step. In particular, the annealing step may be a thermal annealing step. Annealing can bring the dopants up to the surface.

The method of manufacturing a semiconductor substrate may preferably further comprise a step e) carried out between steps a) and b), which consists in forming a screening layer, in particular, a screening oxide, on the handle substrate. By using a screening layer or sacrificial layer, in particular a screening or sacrificial oxide, the variability related to channeling and substrate surface mis-orientation during the ion implantation can be suppressed.

In a further variant, prior to step c), the screening layer may be removed or stripped.

The method may further comprise a step f) carried out between steps a) and c), which consists in forming a predetermined splitting area at a depth h inside the donor substrate and a step g) carried out after step c) which consists in detaching a remainder of the donor substrate from the donor-handle combination wherein detachment occurs at the predetermined splitting area.

Layers, in particular, with a thickness in the range of micrometers, can be transferred onto the handle substrate. With the inventive method, thin layers, in particular, with a thickness of less than 400 nm, more in particular less than 200 nm, can be transferred. As the surface of the handle substrate remains essentially unaffected with the inventive method, the bonding quality of the handle substrate is better compared to the prior art.

Forming the predetermined splitting area may comprise an ion implantation step. The depth h of the predetermined splitting area may be determined by the energy of the implanted ions. The implanted ions for forming the predetermined splitting area may be hydrogen or rare gas ions (e.g., He, Ar, etc.).

The method may further comprise a step h) carried out between steps a) and c) which consists of forming a dielectric layer, in particular, an oxide layer, or a combination of stacked layers comprising at least one dielectric layer on the donor substrate, in particular, wherein the dielectric layer has a thickness of less than 200 nm, in particular, less than 100 nm. Thereby, the SOI substrate may be obtained with buried doped regions. This SOI substrate can have a thin dielectric and eventually also a thin top semiconductor layer.

The method according to the invention thus enables obtaining doped regions in the handle substrate and at the same time a contamination of the transferred layer with a doping tail like that occurring in the prior art can be prevented.

The dielectric layer may be formed by oxidizing the donor substrate, which can be achieved by a thermal process. Alternatively, the dielectric layer can be provided by deposition. In a variant, a dielectric layer may be formed on the handle substrate.

The pattern of one or more doped regions may comprise one or more lines and/or one or more islands. A line may particularly be a straight or curved line, wherein the length of the line is significantly larger than the width of the line.

The pattern of one or more doped regions may comprise at least one well region and/or at least one back gate. Thereby the desired dopant patterns and dopant profiles in depth perpendicular to the handle substrate surface can be better created, wherein due to the fact that the dopant pattern is formed prior to bonding, any dimensions can be achieved. Between the well and back gate formation steps, additional annealing steps can be included.

At least one well region and at least one back gate may be formed using the same mask. This will simplify the process.

The method may further comprise a surface treatment step, in particular, comprising a CMP polishing (chemical-mechanical polishing) of the top semiconductor layer after the detachment step of the semiconductor substrate and/or a cleaning step before and/or after the polishing step.

Advantageously, the surface where the detaching occurred may be treated using an annealing step, in particular, a thermal annealing step. In this way, surface irregularities may be smoothed.

Another aspect of the invention relates to a method for manufacturing a semiconductor substrate, in particular, a semiconductor-on-insulator (SOI) substrate, comprises the steps of: a) providing a donor substrate and a handle substrate, b) forming one or more alignment marks in, in particular inside, the handle substrate, and then c) attaching, in particular by bonding, the donor and the handle substrate to obtain a donor-handle compound.

Alignment marks will allow the formation of patterns at predetermined locations of the handle substrate and/or in other layers of the substrate, in particular, in the donor substrate.

In this context, the term "inside" means that the alignment marks are buried, typically in a depth of less than about 10 µm, such that the surface of the handle substrate is essentially unaffected by the alignment marks.

By forming the alignment marks in, in particular, inside, the handle substrate, i.e., below the handle substrate surface, the surface remains essentially unaffected, such that the bonding quality of the handle substrate is better compared to the prior art. This invention is independent of the lithography technique utilized. It remains compatible with the most advanced lithography techniques like immersion, EUV, and e-beam lithography.

In particular, the alignment marks may be formed such that they essentially do not alter the surface of the handle substrate as compared to alignment marks formed by filled trenches known in the art. The alignment marks or structures used in the prior art have to be typically planarized using thick dielectric layers and the material mix could even lead to stress inside the material. The use of the prior art may also cause formation of voids at the bonding interface. Thus, whereas the prior art marks could not be combined with thin dielectric layers or semiconductor layers, the alignment marks according to the invention are compatible with thinner buried dielectric layers, for example, having a thickness smaller than 200 nm, in particular, less than 100 nm, as stress can be prevented and no planarization becomes necessary. The handle substrate surface in the inventive method remains better prepared for bonding.

The method, in particular, the step of forming one or more alignment marks, may comprise one or more of the features described above.

The invention further provides a semiconductor substrate comprising a donor-handle combination with one or more alignment marks and/or a pattern of one or more doped regions in the handle substrate.

The one or more alignment marks and/or the pattern of one or more doped regions in the handle substrate may comprise one or more of the above-described features obtained during the various process steps. The semiconductor substrate may particularly correspond to a donor-handle combination as formed in step c) of the above-described methods.

The semiconductor substrate may further comprise a predetermined splitting area at a depth h inside the donor substrate.

The invention further provides a semiconductor-on-insulator substrate, comprising a substrate layer, a semiconductor layer and a dielectric layer, in particular, an oxide layer, between the substrate layer and the semiconductor layer, wherein the substrate layer comprises one or more alignment marks and/or a pattern of one or more doped regions.

The dielectric layer may correspond to a buried oxide layer (BOX). The one or more alignment marks and/or the pattern of one or more doped regions may comprise one or more of the above-mentioned features obtained during the various process steps.

The pattern of one or more doped regions may be designed and/or arranged such that they do not extend into the semiconductor layer and/or the dielectric layer. In this way, the pattern of one or more doped regions does not alter the characteristics of a device formed on the semiconductor layer by generating a random dopant fluctuation (RDF), which will induce a threshold voltage variability. The threshold voltage variability observed in the art in turn negatively impacts the parameters of integrated circuits causing threshold voltage offset and mismatch. Typical corrective action is to oversize some critical circuit modules in order to compensate for this random variability. Thus, by reducing, in particular, essentially eliminating, RDF in the inventive substrate, a significant surface area gain is enabled for the integrated circuits. This is even further improved by the reduced resist edge ion implantation deflection effect described above. Hence, the semiconductor-on-insulator substrate may be used to produce more reproducible devices and more compact and robust circuits.

In FIGS. 1a to 1e, the treatment of a handle substrate 101 is shown, according to an exemplary method for manufacturing a semiconductor substrate. In FIG. 1a, a handle substrate 101 is provided.

The handle substrate 101 may be any suitable handle substrate, in particular a silicon wafer. The handle substrate 101 may also be a glass or quartz-type substrate.

Figure 1B:
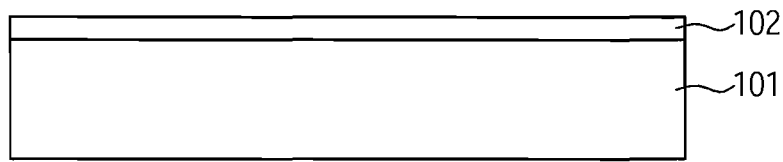

In FIG. 1b, a screening layer 102, in particular, a screening oxide, is formed on a main surface of the handle substrate 101. Depending on the process, this screening layer 102 might not be necessary.

In the next process step, alignment marks 103a, 103b are formed inside the handle substrate 101. This is achieved by performing an ion implanting through the screening layer 102. In this embodiment the implanting species is a non-dopant specie, for example, argon or fluorine, which are species typically available in a fabrication line.

Figure 1C:
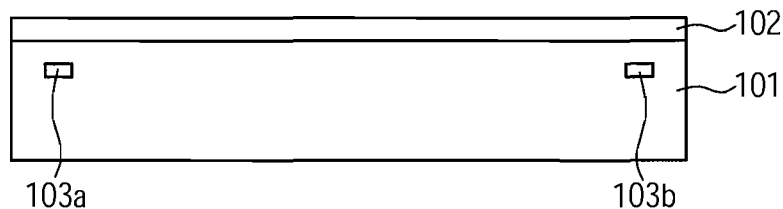

The result of this step is shown in FIG. 1c.

The alignment marks 103a and 103b are formed from a non-dopant specie, i.e., the alignment marks 103a and 103b do not dope the substrate 101. Furthermore, due to the ion implantation process, the alignment marks 103a and 103b do not alter the surface of the handle substrate 101. In other words, the alignment marks 103a and 103b correspond to alignment marks that are buried in the handle substrate 101. Furthermore, the alignment marks 103a and 103b, which relate to defects in the handle substrate 101, do not diffuse, thereby generating stable alignment marks in size and position.

By the ion implantation process, it is possible to generate fine and possibly minimal feature implantation regions, where minimal features correspond to the smallest geometry that can be defined with a given lithography technology and reproducible and reliable alignment marks that are compatible with standard lithography but also with immersion and EUV (extreme ultraviolet) lithography requirements. Indeed, the alignment marks are preferably defined by using a mask formed on top of the screening layer 102. The masking layer may, e.g., be patterned by lithography techniques. The implantation step can then be carried out by a full wafer area implantation apparatus.

As a variant of this embodiment, other suitable processes to form the alignment marks inside the handle substrate could be applied, e.g., focused laser or focused ion beam techniques.

Modern lithography tools are equipped with alignment tools that can identify the alignment marks, like infrared (IR) alignment lasers that are suited for identifying the buried alignment marks in the handle wafer with nanometric precision.

Figure 1D:
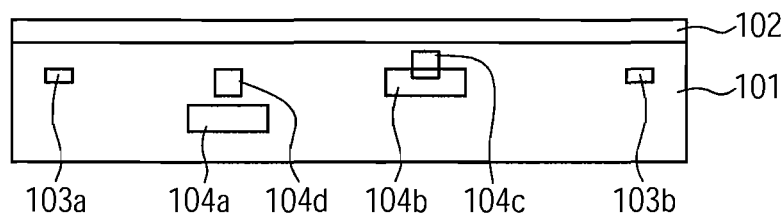

In FIG. 1d, additionally, a pattern of doped regions 104a, 104b, 104c and 104d is shown. This pattern of doped regions 104a to 104d has been formed using one or more ion implantation steps. The doped regions 104a to 104d may be implanted at different depths. Doped regions 104a and 104d, for example, are implanted at different depths, while doped regions 104b and 104c are partly overlapping.

The doped regions can correspond to n- and/or p-wells and/or n- and/or p-back gates.

The doped region 104a may correspond to an n-well comprising phosphorous as a dopant. The concentration of the dopant may be between $10^{16}$ and $10^{18}$ cm$^{-3}$. There are several options to form such a doped region, for example, implantation and diffusion further into the handle substrate 101 but also upward toward its surface by an annealing step.

Doped region 104b may correspond to a p-well comprising boron as a dopant specie. The concentration of the dopant may lie between $5.0\times10^{16}$ and $5.0\times10^{18}$ cm$^{-3}$. There are several options to form such a doped region, for example implantation and diffusion further into the handle substrate 101 but also upward toward its surface by an annealing step.

Doped region 104c may correspond to an N+gate, particularly comprising arsenic, and doped region 104d may correspond to a P+gate, in particular, comprising boron. Typical process conditions for gate regions are: for the N-gate, doping with an energy in the range of 5-50 keV and doses between $5\times10^{14}$ cm$^{-2}$ and $5\times10^{15}$ cm$^{-2}$; and for the P-gate, doping with an energy in the range of 5-50 keV with doses between $5\times10^{14}$ cm$^{-2}$ and $5\times10^{15}$ cm$^{-2}$.

Doped regions 104a and 104b may correspond to well regions. Typical process conditions for the well regions are energies in the range of 50-100 keV and doses between $5\times10^{12}$ cm$^{-2}$ and $1\times10^{14}$ cm$^{-2}$.

After the implantation steps of the buried alignment marks 103a and 103b and the pattern of doped regions 104a to 104d, a next step consists in removing or stripping the screening oxide 102 from the handle substrate 101. The processed handle substrate 101 without the screening oxide 102 is shown in FIG. 1e.

Figure 1E:
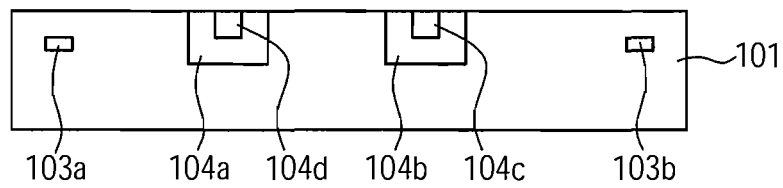

In FIG. 1e, the pattern of doped regions 104a to 104d of FIG. 1d has been processed using annealing steps. In this way, diffusion further into the handle substrate 101 but also upward toward its surface has been achieved.

The pattern of FIG. 1e is only for illustrative purposes. Of course, any other arrangement of the various regions can be achieved depending on process conditions.

Figure 2A:
FIGS. 2a to 2c illustrate a donor substrate at different steps of an exemplary method for manufacturing a semiconductor substrate according to the invention.
Figure 2B:
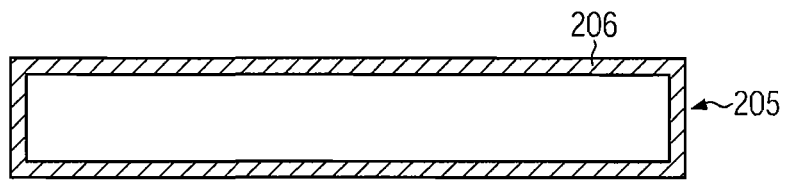
Figure 2C:
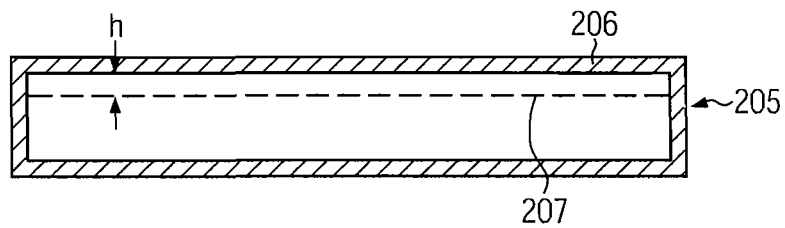

In FIGS. 2a to 2c, a treatment of a donor substrate according to an exemplary method for manufacturing a semiconductor substrate according to the invention is shown. First, a donor substrate 205 is provided in FIG. 2a. The donor substrate 205 can be a semiconductor substrate, in particular, one out of a silicon (Si), a silicon carbide, a silicon germanium, a gallium nitride or a germanium substrate.

A dielectric layer 206 is then provided on the donor substrate 205 (see FIG. 2b). The dielectric layer 206 may be formed either by a thermal process or by deposition. For example, the dielectric layer 206 may be at least one out of silicon dioxide, silicon nitride, silicon oxynitride or $Al_2O_3$, etc., or a combination of stacked layers comprising at least one layer at least one of silicon dioxide, silicon nitride, silicon oxynitride or $Al_2O_3$, etc.

According to a variant, the step as illustrated in FIG. 2b may also be omitted, e.g., in case of direct silicon bonding without an intervening dielectric layer.

In FIG. 2c, the result of the next process step is illustrated consisting in forming a predetermined splitting area 207 inside the donor substrate 205. The predetermined splitting area 207 is formed by an ion implantation step, during which ions like hydrogen or rare gas ions (helium, argon, etc.) are implanted into the donor substrate 205. The depth h of the predetermined splitting area 207 can be determined by the energy of the implanted ions.

Figure 3A:
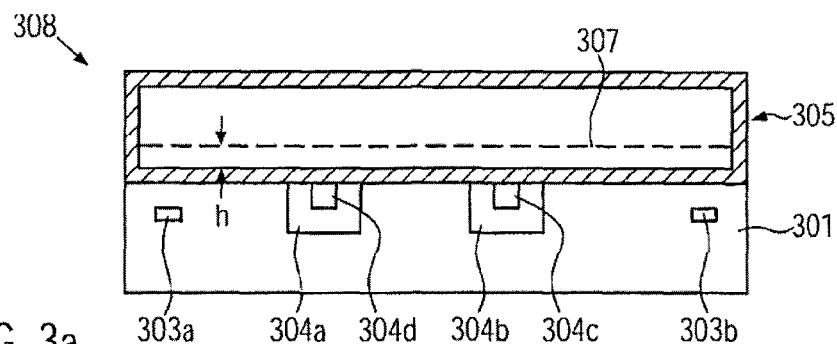
FIGS. 3a and 3b illustrate steps of an exemplary method for manufacturing a semiconductor substrate according to the invention.
Figure 3B:
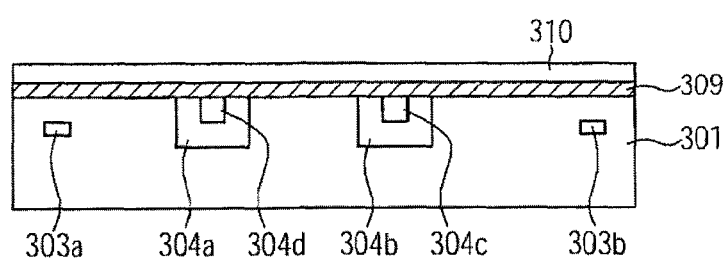

In FIGS. 3a and 3b, further steps of the exemplary method for manufacturing a semiconductor substrate according to the invention are shown.

FIG. 3a shows a donor-handle combination 308 obtained by attaching, in particular by bonding, the donor substrate 305 and the handle substrate 301. In particular, the donor-handle combination 308 of FIG. 3a may be formed by attaching a handle substrate 101 (see FIG. 1e) and a donor substrate 205 (see FIG. 2c).

Upon a mechanical and/or thermal treatment, a detachment of a semiconductor layer 310, together with a buried dielectric layer 309, occurs at a predetermined splitting area 307 so that the two layers 309, 310 are transferred onto the handle substrate 301 to obtain the silicon-on-insulator structure as shown in FIG. 3b with buried alignment marks 303a, 303b and doped regions 304a to 304d.

Actually, during a thermal treatment carried out during the detachment step, microcavities resulting in the formation of microsplittings or microcracks are not only achieved at the predetermined detachment area 307 leading to complete detachment but also in the area of the alignment marks 303a, 303b. The changed crystallographic properties in these regions can then be exploited to observe the alignment marks 303a, 303b during subsequent lithography fabrication steps. As an alternative, each ion implantation step may be followed by a dedicated thermal annealing.

Figure 4A:
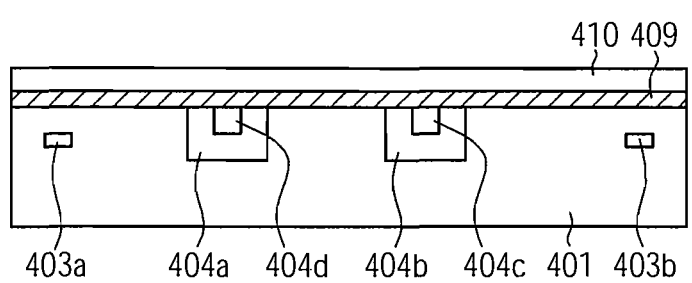
FIGS. 4a and 4b illustrate an exemplary silicon-on-insulator substrate with inventive dopant profile.

In FIG. 4a, the exemplary semiconductor-on-insulator substrate of FIG. 3b is again shown. A semiconductor layer 410 is provided over a handle substrate 401 with a buried dielectric layer 409 in between. In the handle substrate 401, buried alignment marks 403a, 403b and doped regions 404a to 404d are shown.

Figure 4B:
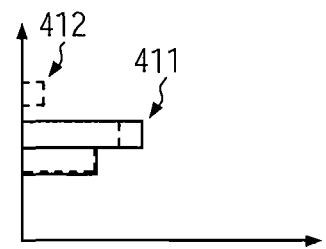

In FIG. 4b, the respective dopant concentration profile is illustrated as a solid line 411. It can be seen that the maximum of the dopant concentration, e.g., a gate region, is near the interface of the handle substrate 401 and the buried dielectric layer 409. Thanks to implanting prior to bonding, the semiconductor layer 410 is not affected by the high doping concentration in the handle substrate 401. Below the gate region a second region with a lower dopant concentration, e.g., a well region, can be observed.

For comparison, a typical dopant profile according to the prior art is shown as a dashed line 412. It can be seen that in the profile according to the prior art, a dopant concentration is also present in the semiconductor layer 410. This non-zero concentration in the semiconductor layer 410 stems from the implantation tail caused by the implanting through the top semiconductor layer and subsequent anneal steps. At the same time, the maximum dopant concentration at the interface between handle substrate 401 and the buried dielectric layer 409 is reduced compared to the concentration that can be achieved by the inventive method.

In the following, practical examples according to the invention will be described.

According to a first example, argon is used to form buried alignment marks in a handle substrate. The energy for the ion implantation step is between 50 and 250 keV with a dose range of $1\times10^{14}$ to $5\times10^{15}$ cm$^{-2}$. The ion implantation is performed through a sacrificial oxide, which is removed after implantation of all the required implants. Argon is particularly advantageous as it is cheap and available in industrial implanters.

According to a second example, fluorine is used for the buried alignment marks. The energy range may be between 25 and 150 keV at a dose range of $1\times10^{15}$ to $1\times10^{16}$ cm$^{-2}$. Boron trifluoride (BF$_3$) gas may be used to obtain atomic boron for doping purposes.

According to a third to fifth example, fluorine, neon or xenon may be used for the generation of alignment marks. It is desired to keep the same level and morphology of structural damage as in the case of argon. For example, fluorine may be implanted at 60 keV and a dose of $1\times10^{16}$ cm$^{-2}$, followed by a thermal annealing step with 700° C. for one hour and a 1100° C. spike anneal.

After the generation of the buried alignment marks, a P-well and an N-well may be formed using ion implantation using the following generic recipes.

P-Well: For example, boron implantation and anneal. The p-well formation can be achieved with just one single implant plus diffusion. But, if necessary, high energy implant multiple doses and implantation energies can be utilized, followed by an annealing step to form the p-well region.

N-Well: For example, phosphorus and/or arsenic, implantation and anneal. The n-well formation can be achieved with just one single implant plus diffusion. But, if necessary, high energy implant multiple doses and implantation energies can be utilized followed by an annealing step to form the n-well region Buried gates may be formed using the following generic recipes.

N-gate: Arsenic or phosphorus, followed by an activation anneal.

P-gate: Boron or indium, followed by an activation anneal.

A possible process flow of an exemplary method for manufacturing a semiconductor substrate according to the invention may thus comprise the following subsequent steps:

1) Oxidation or deposition of a screening oxide on handle substrate;
2) Implantation and formation of alignment marks;
3) Implantation of a deep n-well (concentration $10^{16}$–$10^{18}$ at/cm$^{-3}$), dopant specie, e.g., phosphorus;
4) Anneal;
5) Implantation of a p-well (concentration $5\times10^{16}$–$5\times10^{18}$ at/cm$^{-3}$), dopant specie e.g. boron;
6) Anneal;
7) Implantation of the N+gate, e.g., with arsenic;
8) Anneal;
9) Implantation of the P+gate, e.g., with boron;
10) Anneal;
11) Strip the screening oxide; and
12) Prepare for bonding with donor substrate.

Alternatively, the well and the respective gate implant both can be done together using the same mask.

By providing alignment marks and dopant regions prior to bonding inside the handle substrate, dopant concentration tails inside the transferred layer and, thus, in device layers, can be prevented, and the dopant profiles can be tailored as necessary.

In the above-described embodiments and examples, alternatively, only the alignment marks may be provided in the handle substrate. In other words, the pattern of one or more doped regions in the handle substrate may be omitted. The alignment marks may be used for alignment purposes during subsequent process steps affecting the transferred semiconductor and buried dielectric layer. By forming the alignment marks in, in particular, the inside, the handle substrate, i.e., below the handle substrate surface, the surface remains essentially unaffected, such that the bonding quality of the handle substrate is better compared to the prior art.

Although the previously discussed embodiments and examples of the present invention have been described separately, it is to be understood that some or all of the above-described features can also be combined in different ways. The discussed embodiments are not intended as limitations but serve as examples illustrating features and advantages of the invention.

What is claimed is:

1. A method for manufacturing a semiconductor substrate, comprising:
providing a donor substrate and a semiconductor handle substrate;
implanting ions into the semiconductor handle substrate and forming one or more alignment marks buried completely inside the semiconductor handle substrate by the implantation of the ions, the one or more alignment marks being configured to be detectable using electromagnetic radiation in the infrared region of the electromagnetic spectrum;
forming a plurality of doped regions buried completely inside the semiconductor handle substrate, each doped region of the plurality of doped regions comprising one or more dopants; and
attaching the donor substrate and the semiconductor handle substrate together by molecular bonding to obtain a donor-handle combination, at least one of the donor substrate and the handle substrate including a surface layer of an insulator such that the donor-handle combination forms a semiconductor-on-insulator semiconductor substrate.

2. The method of claim 1, wherein the implanted ions used in the formation of the one or more alignment marks comprise one or more non-dopant species.

3. The method of claim 2, wherein the one or more non-dopant species comprise H, He, Ar, F, Ne, Xe or a combination thereof.

4. The method of claim 1, further comprising thermal annealing of the donor-handle combination.

5. The method of claim 1, wherein forming the plurality of doped regions buried completely inside the semiconductor handle substrate comprises at least one ion implantation step for implanting the one or more dopants.

6. The method of claim 5, wherein the one or more dopants comprise phosphorus, arsenic, boron or a combination thereof.

7. The method of claim 5, wherein the at least one ion implantation step is followed by an annealing step.

8. The method of claim 1, further comprising forming a screening layer by applying a screening oxide on the semiconductor handle substrate prior to forming the plurality of doped regions.

9. The method of claim 1, further comprising, prior to attaching the donor substrate and the semiconductor handle substrate together, forming a predetermined splitting area at a depth inside the donor substrate and detaching a remainder of the donor substrate from the donor-handle combination at the predetermined splitting area after attaching the donor substrate and the semiconductor handle substrate together.

10. The method of claim 1, further comprising forming at least one dielectric layer on the donor substrate prior to the attaching the donor substrate and the semiconductor handle substrate together.

11. The method of claim 10, wherein the at least one dielectric layer comprises an oxide and has a thickness of less than 100 nm.

12. The method of claim 1, wherein the one or more doped regions comprises one or more doped line regions or one or more doped island regions.

13. The method of claim 1, wherein the one or more doped regions comprises at least one well region and at least one back gate, and wherein both the at least one well region and at least one back gate are formed using the same mask.

14. A method for manufacturing a semiconductor substrate, comprising:

providing a donor substrate and a handle substrate;

implanting ions into the handle substrate and forming one or more alignment marks buried completely inside the handle substrate by the implantation of the ions so that the top surface of the handle substrate remains planar, the one or more alignment marks being configured to be detectable using electromagnetic radiation in the infrared region of the electromagnetic spectrum; and attaching the donor substrate and the handle substrate together to obtain a semiconductor substrate including a donor-handle combination.

15. A semiconductor-on-insulator substrate, comprising:

a semiconductor substrate layer having a planar top surface; and a semiconductor layer molecularly bonded to the planar top surface of the semiconductor substrate layer with a dielectric layer therebetween;

one or more alignment marks buried completely inside the semiconductor substrate layer and comprising one or more implanted non-dopant species, the one or more alignment marks configured to be detectable using electromagnetic radiation in the infrared region of the electromagnetic spectrum; and a plurality of doped regions buried inside the semiconductor substrate layer, each doped region of the plurality of doped regions comprising one or more dopants.

* * * * *

UNITED STATES PATENT AND TRADEMARK OFFICE
CERTIFICATE OF CORRECTION

PATENT NO. : 9,035,474 B2
APPLICATION NO. : 12/793515
DATED : May 19, 2015
INVENTOR(S) : Carlos Mazure et al.

Page 1 of 1

It is certified that error appears in the above-identified patent and that said Letters Patent is hereby corrected as shown below:

In the specification:

| | | |
|---|---|---|
| COLUMN 7, | LINE 19, | change "for example" to --for example,-- |
| COLUMN 7, | LINE 27, | change "$5\times10^{14}$ cm-$^{2}$" to --$5\times10^{14}$ cm$^{-2}$-- |
| COLUMN 8, | LINE 40, | change "region ,is" to --region, is-- |
| COLUMN 9, | LINE 26, | change "region" to --region.-- |
| COLUMN 9, | LINE 38, | change "$10^{16\text{-}}\ 10^{18}$" to --$10^{16} - 10^{18}$-- |
| COLUMN 9, | LINE 41, | change "$5\times10^{16}\text{-}5\times10^{18}$" to --$5\times10^{16} - 5\times10^{18}$-- |

Signed and Sealed this
Fifteenth Day of December, 2015

Michelle K. Lee
*Director of the United States Patent and Trademark Office*